United States Patent
Imamura

(10) Patent No.: US 9,239,500 B2
(45) Date of Patent: Jan. 19, 2016

(54) THIN FILM TRANSISTOR ARRAY SUBSTRATE, MANUFACTURING METHOD THEREOF, AND LIQUID CRYSTAL DISPLAY DEVICE

(75) Inventor: Takuji Imamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 300 days.

(21) Appl. No.: 13/323,159

(22) Filed: Dec. 12, 2011

(65) Prior Publication Data

US 2012/0187405 A1    Jul. 26, 2012

(30) Foreign Application Priority Data

Jan. 25, 2011  (JP) .................................. 2011-012990

(51) Int. Cl.
  H01L 27/14    (2006.01)
  H01L 29/04    (2006.01)
  H01L 29/15    (2006.01)
  H01L 31/036   (2006.01)
  G02F 1/1343   (2006.01)
  H01L 27/32    (2006.01)
  H01L 27/12    (2006.01)

(52) U.S. Cl.
  CPC ...... *G02F 1/134363* (2013.01); *H01L 27/1214* (2013.01); *H01L 27/3262* (2013.01); *G02F 2001/134372* (2013.01); *H01L 27/124* (2013.01)

(58) Field of Classification Search
  CPC .................... H01L 27/1214; H01L 27/3262
  USPC ....................... 257/69, 72, E27.111
  See application file for complete search history.

(56) References Cited

U.S. PATENT DOCUMENTS

| | | | |
|---|---|---|---|
| 2003/0043330 A1 | 3/2003 | Kim et al. | |
| 2003/0098939 A1 | 5/2003 | Min et al. | |
| 2004/0246425 A1 | 12/2004 | Ootsu et al. | |
| 2005/0030461 A1 | 2/2005 | Ono et al. | |
| 2005/0105032 A1 | 5/2005 | Ono et al. | |
| 2007/0035675 A1 | 2/2007 | Um et al. | |
| 2007/0263132 A1* | 11/2007 | Yang | 349/43 |
| 2008/0002079 A1* | 1/2008 | Kimura | 349/42 |
| 2008/0017887 A1 | 1/2008 | Nagata et al. | |

FOREIGN PATENT DOCUMENTS

| | | |
|---|---|---|
| JP | 2001-56476 | 2/2001 |
| JP | 2003-84303 | 3/2003 |
| JP | 2004-361700 | 12/2004 |
| JP | 2005-148534 | 6/2005 |
| JP | 2007-47797 | 2/2007 |
| JP | 2010-54980 | 3/2010 |
| JP | 2010-66646 | 3/2010 |
| WO | WO 01/18597 A1 | 3/2001 |

OTHER PUBLICATIONS

Office Action issued Jul. 15, 2014 to Japanese Patent Application No. 2011-012990, with English translation.

* cited by examiner

*Primary Examiner* — Robert Huber
(74) *Attorney, Agent, or Firm* — Oblon, McClelland, Maier & Neustadt, L.L.P.

(57) ABSTRACT

A TFT array substrate includes a plurality of pixels arranged in a matrix, in which the pixel includes a thin film transistor, a pixel electrode conductively connected to a drain electrode, and a common electrode that is formed opposite the pixel electrode with an insulation film interposed therebetween. In the TFT array substrate, when one of the pixels is focused, the pixel electrode is divided into a plurality of divided pixel electrodes and includes a plurality of branch conductive parts that conductively connect each of the drain electrode and the plurality of divided pixel electrodes, and in plane view, the common electrode is not formed in at least a part of a formation region of the plurality of branch conductive parts.

7 Claims, 6 Drawing Sheets

THIN FILM TRANSISTOR ARRAY SUBSTRATE, MANUFACTURING METHOD THEREOF, AND LIQUID CRYSTAL DISPLAY DEVICE

INCORPORATION BY REFERENCE

This application is based upon and claims the benefit of priority from Japanese patent application No. 2011-12990, filed on Jan. 25, 2011, the disclosure of which is incorporated herein in its entirety by reference.

BACKGROUND OF THE INVENTION

1. Field of the Invention

The present invention relates to a thin film transistor array substrate, a manufacturing method thereof, and a liquid crystal display device using the same.

2. Description of Related Art

A liquid crystal display device is one of thin panels, and widely used for monitors of personal computers and portable information terminal devices and TVs taking advantages including low power consumption and small and lightweight. The mainstream of current liquid crystal display devices is an active-matrix type including a plurality of display signal wires and a plurality of scanning signal wires arranged in a lattice pattern, and a thin film transistor (hereinafter referred to as TFT) formed as a switching element in a pixel region surrounded by the display signal wires and the scanning signal wires.

There is an increasing demand to a high-definition image display device by the development of multimedia industry.

The TN (Twisted Nematic) mode which is a conventional liquid crystal mode is a method to change a display state of on and off by applying a vertical electric field vertical to the substrate, raising and dropping liquid crystal molecules against a substrate surface according to an applied state of voltage. The TN mode does not have a good viewing angle characteristic due to its principle.

IPS (In-Plane Switching and IPS is a registered trademark of Hitachi Displays Ltd.) mode is a method to change the display state of on and off by applying a horizontal electric field substantially parallel to the substrate and moving liquid crystal molecules in plane which is substantially parallel to the substrate. The IPS mode has a wider viewing angle characteristic as compared to the TN mode, and is used for TV use etc.

In recent years, the FFS (Fringe Field Switching) mode, the improved IPS mode, has been developed. The FFS mode is a method to move the liquid crystal molecules by applying an oblique electric field not only the horizontal electric field, which is substantially parallel to the substrate, and has an excellent viewing angle characteristic in a similar manner as IPS.

In the IPS mode, both of a pixel electrode and a common electrode for driving liquid crystals are made to be a comb shape, and are arranged to interdigitate without the combs not touching each other. The IPS mode is a configuration in which the pixel electrode and the common electrode do not overlap in plane view. Usually, the gap between the pixel electrode and the common electrode in the IPS mode is larger than a cell gap and an electrode width.

In the IPS mode, the liquid crystal molecules that are positioned between the pixel electrode and the common electrode are driven in plane view, however the liquid crystal molecules that are positioned immediately above the pixel electrode and the common electrode are hardly driven. Therefore, the section immediately above the pixel electrode and the common electrode cannot contribute to display, and the transmittance is low, and thus it is difficult to obtain bright display properties.

On the other hand, in the FFS mode, the pixel electrode and the common electrode are disposed opposite with an insulation film interposed therebetween, and between the pixel electrode and the common electrode, a lower electrode does not include an opening, and an upper electrode is formed in a shape including an opening that generates a fringe electric field between the upper electrode and the lower electrode. The FFS mode is a configuration in which the pixel electrode and the common electrode overlap with an insulation film interposed therebetween in plane view.

For example, in the liquid crystal display device shown in FIG. 1 and FIG. 2 of International Patent Publication No. WO2001/018597, the upper electrode includes a plurality of slit-shaped openings in a plate-shaped electrode. In the liquid crystal display device shown in FIG. 3 of Japanese Unexamined Patent Application Publication No. 2001-056476 and FIG. 3 of Japanese Unexamined Patent Application Publication No. 2003-084303, the upper electrode has a comb structure.

The gap between the pixel electrode and the common electrode in the FFS mode is smaller than the cell gap and the electrode width.

In the FFS mode, the liquid crystal molecules positioned immediately above the electrode can be driven by using the oblique electric field. Therefore, when the pixel electrode and the common electrode are formed of a transparent conductive film such as an indium tin oxide (ITO), an electrode part can also contribute to display. Accordingly, in the FFS mode, higher transmittance can be achieved than the IPS mode.

In the liquid crystal display device of the FFS mode, unlike the TN mode and the IPS mode, two layers of transparent conductive films need be laminated as the pixel electrode and the common electrode with an insulation film interposed therebetween over the same substrate. These two layers of transparent conductive films only have a thin insulation film interposed therebetween, and a short-circuit between the electrodes is generated and a pixel defect may be generated.

In order to reduce the pixel defect due to the short-circuit between the electrodes, the insulation film disposed between the electrodes can be a multilayer structure, however it is not preferable as the number of manufacturing processes increases.

SUMMARY OF THE INVENTION

The present invention is made in light of the above-mentioned background, and aims to provide a TFT array substrate that has a configuration in which the pixel electrode and the common electrode are disposed opposite with the insulation film interposed therebetween and improves the quality of the product even when an electrical defect is generated in a part of pixels.

An exemplary aspect of the present invention is a thin film transistor array substrate that includes a plurality of pixels arranged in a matrix, in which the pixel includes a gate electrode, a gate insulation film, a thin film transistor including a semiconductor film of at least one layer including a channel layer, a source electrode and a drain electrode formed distant from each other, a pixel electrode conductively connected to the drain electrode of the thin film transistor, and a common electrode that is formed opposite the pixel electrode with an insulation film interposed therebetween. When one of the pixels is focused, the pixel electrode is divided into a plurality of divided pixel electrodes and includes a plurality of branch conductive parts that conductively connect each of the drain electrode and the plurality of divided pixel electrodes, and in plane view, the common electrode is not formed in at least a part of a formation region of the plurality of branch conductive parts.

In the thin film transistor array substrate of the present invention, the plurality of branch conductive parts can be composed of the drain electrode, a drain extended part extended from the drain electrode, the pixel electrode, or a pixel electrode extended part extended from the pixel electrode.

Another exemplary aspect of the present invention is a manufacturing method of a TFT array substrate that includes when an electrical defect is generated in a part of the pixel, removing at least a part of the branch conductive part that conductively connects the divided pixel electrode including a generation region of the electrical defect and the drain electrode, and blocking the conductive connection between the divided pixel electrode including the generation region of the electrical defect and the drain electrode.

According to the present invention, it is possible to provide the TFT array substrate that has a configuration in which the pixel electrode and the common electrode are disposed opposite with the insulation film interposed therebetween and improves the quality of the product even when an electrical defect is generated in a part of pixels.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

[First Exemplary Embodiment]

A TFT array substrate according to a first exemplary embodiment of the present invention is explained with reference to the drawings. The TFT array substrate of this exemplary embodiment is used preferably for an active-matrix type liquid crystal display device.

This exemplary embodiment explains a fringe field switching (FFS) mode for transmissive liquid crystal displays as an example.

Figure 1A:
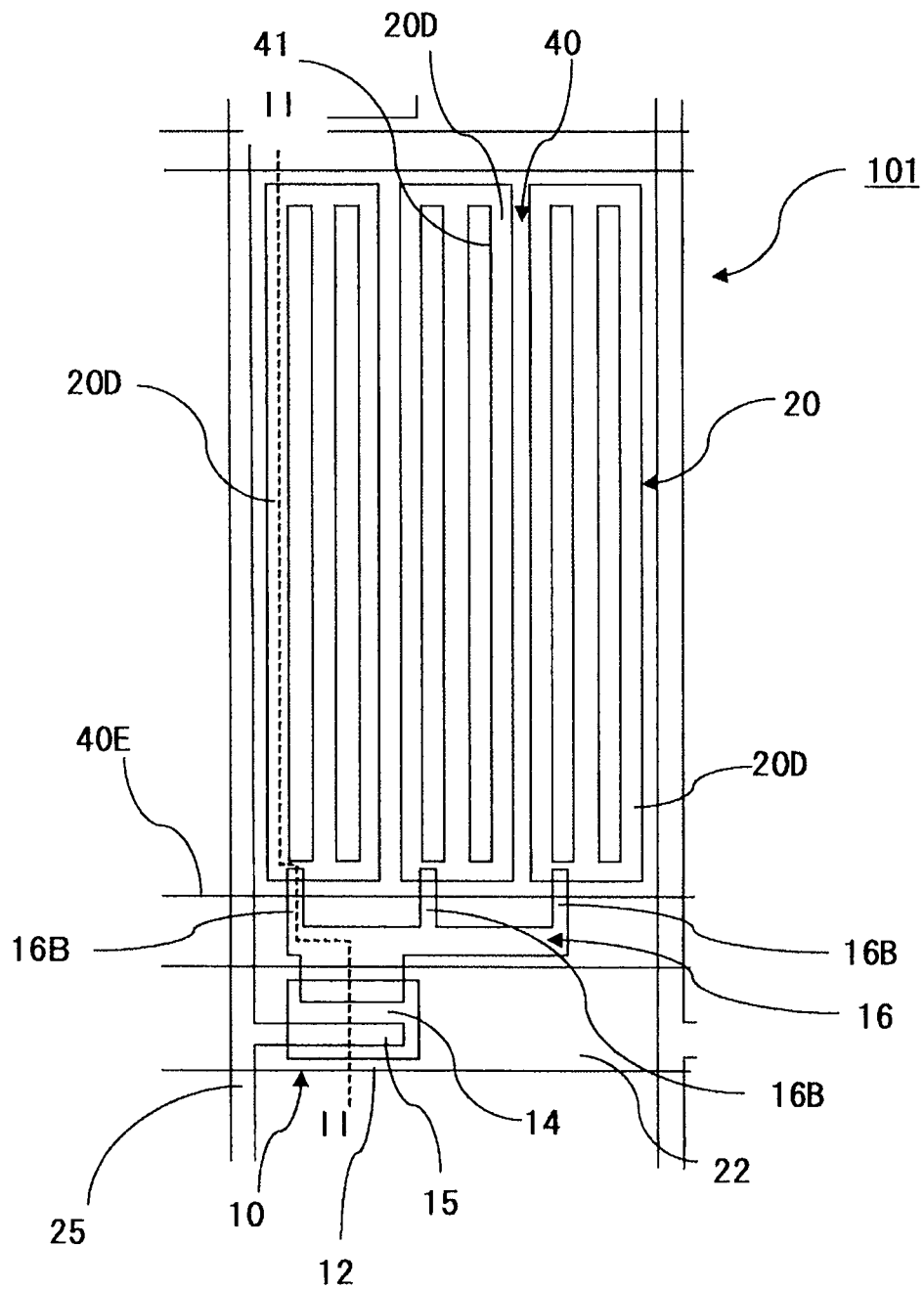
FIG. 1A is a main part plane view showing a configuration of a TFT array substrate according to a first exemplary embodiment.
Figure 1B:
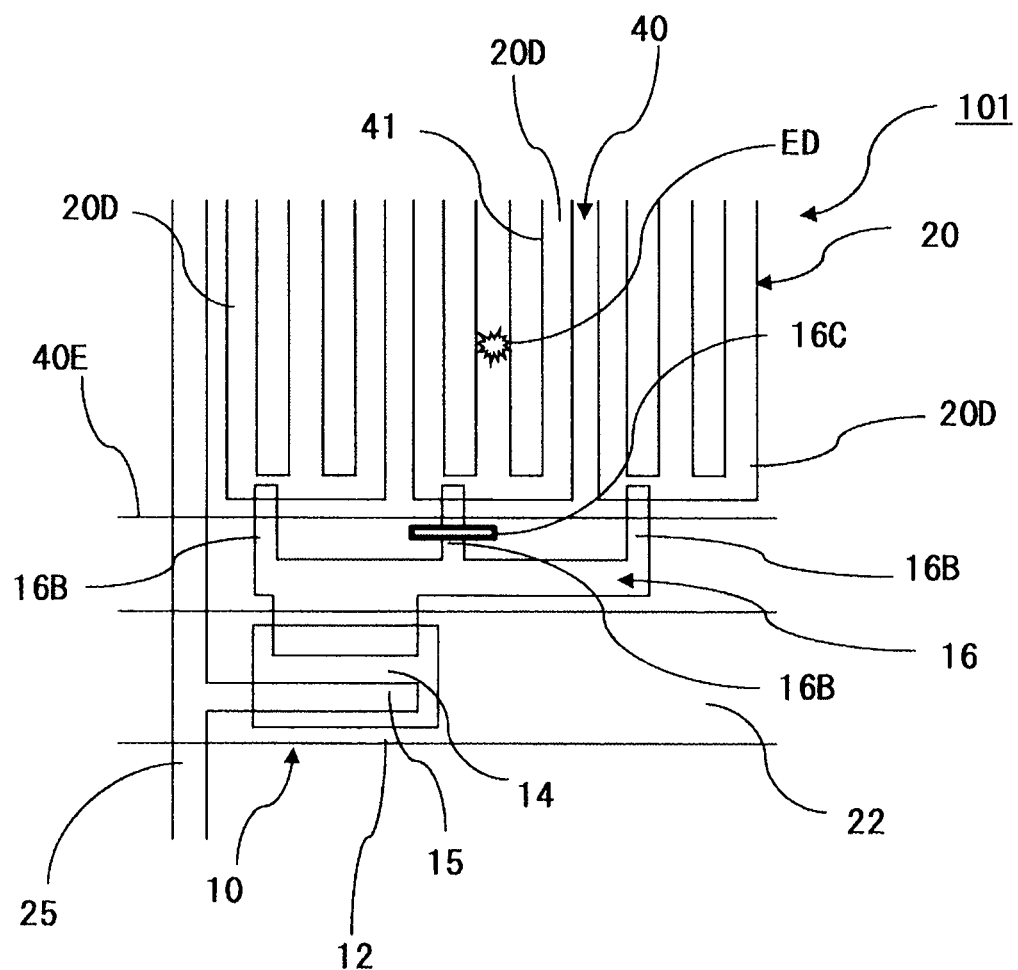
FIG. 1B is a main part plane view showing a manufacturing method of the TFT array substrate according to the first exemplary embodiment.
Figure 2:
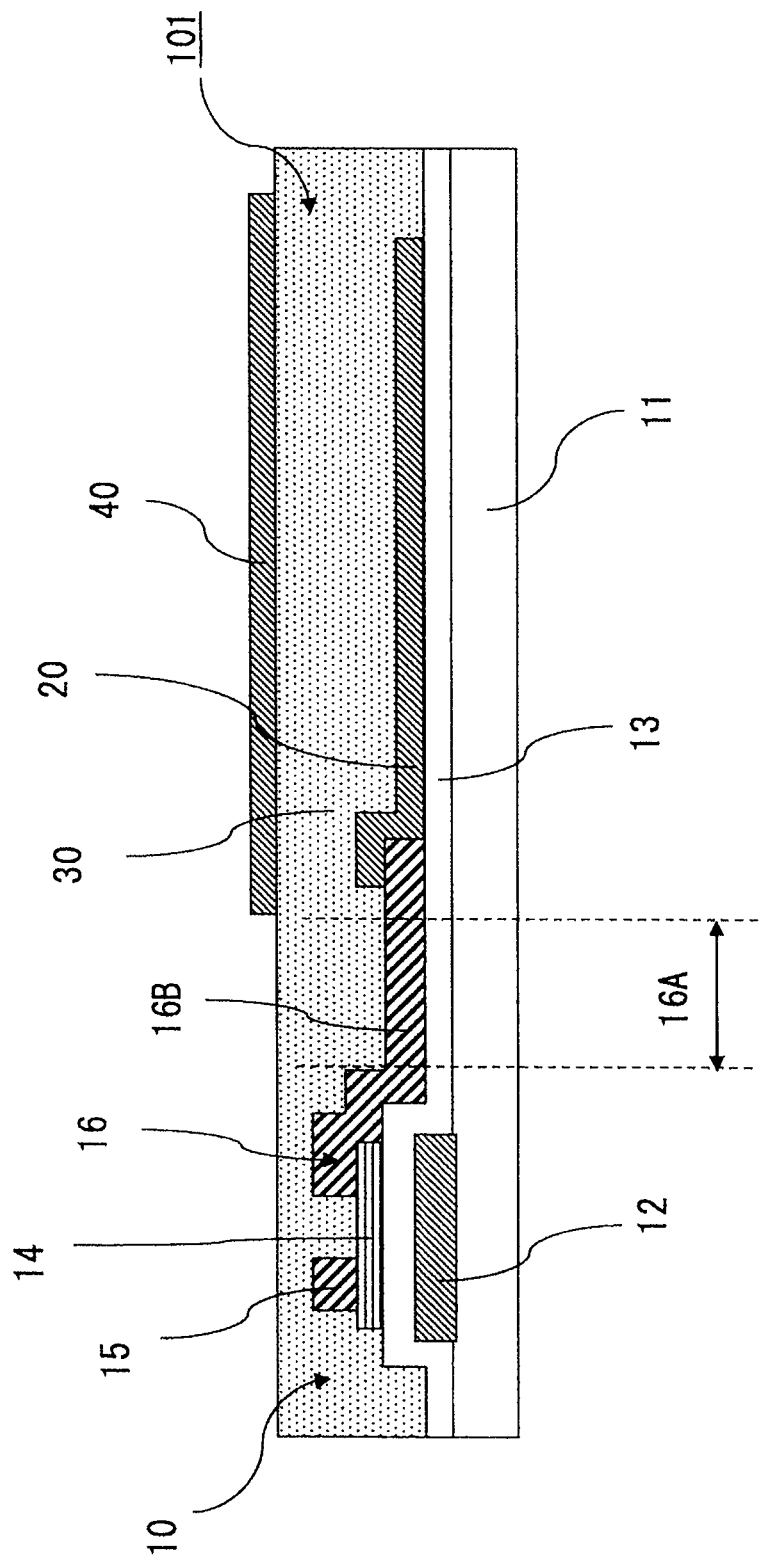
FIG. 2 is a cross-sectional view taken along line II-II of FIG. 1A.

FIG. 1A is a main part plane view showing a configuration of one pixel of the TFT array substrate. FIG. 1B is a main part plane view showing a manufacturing method of the TFT array substrate. These views are perspective diagrams. FIG. 2 is a cross-sectional diagram taken along line II-II of FIG. 1A.

The position and scale of each component in each drawing are for convenience, and they are different from actual ones (the same applies to other exemplary embodiments).

A TFT array substrate 101 of this exemplary embodiment is a substrate in which a plurality of pixels that include, over an insulating substrate 11, a gate electrode 12, a gate insulation film 13, a thin film transistor (TFT) 10 including a semiconductor film 14 of at least one layer including a channel layer, a source electrode 15 and a drain electrode 16, which are formed distant from each other, and a pixel electrode 20 conductively connected to the drain electrode 16 of the TFT 10, are arranged in a matrix.

In this exemplary embodiment, one TFT 10 and one pixel electrode 20 are formed in one pixel. A plurality of TFTs 10 can also be provided in one pixel.

In this exemplary embodiment, the insulating substrate 11 is a transparent substrate formed of glass, plastic, etc. Over this substrate 11, the gate electrode 12 and a gate wire 22 that is connected to the gate electrode 12 are formed by a first metal film.

Over the abovementioned first metal film, the gate insulation film 13 formed of a first insulation film is formed to cover this.

In this exemplary embodiment, the island-shaped semiconductor film 14 of at least one layer including a channel layer is formed over the gate insulation film 13.

In this exemplary embodiment, in plane view, the semiconductor film 14 is patterned in a formation region of the gate electrode 12.

As the semiconductor film 14 of at least one layer including the channel layer, a laminated structure of the channel layer and an ohmic contact layer for ensuring an ohmic contact with source/drain electrodes is preferable.

As the semiconductor film 14 of at least one layer including the channel layer, a laminated structure of an intrinsic semiconductor layer forming the channel layer and an n type impurity semiconductor layer forming the ohmic contact layer is preferable.

As the semiconductor film 14 of at least one layer including the channel layer, a laminated structure of an intrinsic a-Si film and an n type a-Si film doped with an impurity such as phosphorus is preferable. Here, a-Si indicates amorphous silicon.

The source electrode 15, the drain electrode 16, and a source wire 25 that is connected to the source electrode 15 are formed by a second metal film over the substrate 11 where the above semiconductor film 14 is formed.

The region sandwiched between the source electrode 15 and the drain electrode 16 in the semiconductor film 14 is a channel region.

The pixel electrode 20 is formed by connecting to the drain electrode 16 by a first transparent conductive film such as ITO (Indium Tin Oxide) over the substrate 11 where the abovementioned source electrode 15 and the drain electrode 16 are formed.

A passivation film 30 is formed by a second insulation film over the entire substrate 11 where the TFT 10 and the pixel electrode 20 are formed.

A common electrode 40 is formed opposite the pixel electrode 20 by a second transparent conductive film such as ITO over this passivation film 30.

In this exemplary embodiment, the pixel electrode 20 is a lower electrode and the common electrode 40 is an upper electrode.

The TFT array substrate 101 is a FFS mode substrate in which a fringe electric field is generated between the pixel electrode 20 and the common electrode 40. The common electrode 40, which is the upper electrode, includes a plurality of slit-shaped openings 41 extending in parallel towards an extended direction of the source wire 25 formed in a plate-shaped electrode.

In this exemplary embodiment, when focusing on one pixel, the pixel electrode 20 is divided into a plurality of divided pixel electrodes 20D. In plane view, it is preferable that the plurality of openings 41 of the common electrode 40, which is the upper electrode, are included in the formation region of individual divided pixel electrode 20D.

In the example of the drawings, each pixel electrode 20 is divided into three divided pixel electrodes 20D, each divided pixel electrode 20 forms a rectangular shape extending towards the extended direction of the slit-shaped opening 41 of the common electrode 40, and is patterned so that two slit-shaped openings 41 of the common electrode 40 are included in the region of each divided pixel electrode 20D.

However, the design of the shape of each divided pixel electrode 20D, the shape of the opening 41 of the common electrode 40, and the number of openings 41 of the common electrode 40 included in the region of each divided pixel electrode 20D can be modified as appropriate (the same applies to other exemplary embodiments).

The plane shape of the common electrode 40, which is the upper electrode, is not limited to a mode in which the plurality of slit-shaped openings 41 are formed in the plate-shaped electrode, but may be a shape that can generate the fringe electric field with the pixel electrode 20.

In this exemplary embodiment, the opening 41 of the common electrode 40 is a closed rectangular shape surrounded by two long sides and two short sides in plane view. The opening 41 may be a rectangular shape which includes two long sides and only one short side, and the other short side is opened. For example, the plane shape of the common electrode 40, which is the upper electrode, may be a comb structure as in FIG. 3 of Japanese Unexamined Patent Application Publication No. 2001-056476 and FIG. 3 of Japanese Unexamined Patent Application Publication No. 2003-084303 mentioned in the paragraph of "Description of Related Art". The plane shape of the common electrode 40, which is the upper electrode, may be a configuration in which a stripe-shaped electrode is connected at a turning part and forms one electrode, for example.

In this exemplary embodiment, when focusing on one pixel, a part of the drain electrode 16 or a drain electrode extended part extended from the drain electrode 16 composes a plurality of branch conductive parts 16B each conductively connecting the drain electrode 16 and the plurality of divided pixel electrodes 20D.

In this exemplary embodiment, an edge of each branch conductive part 16B is recessed under the corresponding divided pixel electrode 20D, and a part of corresponding divided pixel electrode 20D and the branch conductive part 16B overlap in plane view.

In this exemplary embodiment, in plane view, the common electrode 40 is not formed in the main part of the drain electrode 16 (the part excluding the plurality of branch conductive parts 16B) and a part of the formation region of the plurality of branch conductive parts 16B, and only the edge of the pixel electrode 20 side of the plurality of branch conductive parts 16B overlap the common electrode 40. In FIG. 1A, the numeral 40E indicates an end of the drain electrode 16 side of the common electrode 40.

As for the pattern of the plurality of branch conductive parts 16B, a connection pattern between the corresponding branch conductive part 16B and the divided pixel electrode 20D, an overlap pattern of the corresponding branch conductive part 16B and the divided pixel electrode 20D, and an overlap pattern of the branch conductive part 16B and the common electrode 40, the design can be modified as appropriate.

The branch conductive part 16B may be composed of a part of the divided pixel electrode 20D or a divided pixel electrode part extended from the divided pixel electrode 20D.

The passivation film 30 disposed between the pixel electrode 20 and the common electrode 40 may not maintain the insulating properties due to a foreign object generated during the manufacturing process, and a pixel defect by a short-circuit between the pixel electrode 20 and the common electrode 40 may be generated.

When an electrical defect is generated in a part of a pixel due to the short-circuit between the pixel electrode 20 and the common electrode 40, at least a part of the plurality of branch conductive parts 16B is removed to block the conductive connection between the divided pixel electrode 20D including the generation region of the electrical defect and the drain electrode 16.

In this exemplary embodiment, in plane view, it is the configuration in which the common electrode 40 is not formed in at least a part of the formation region of the plurality of branch conductive parts 16B. In this exemplary embodiment, in the region 16A where the common electrode 40 is not formed, it is possible to easily remove at least a part of the branch conductive part 16B by a laser cut or the like.

If, in plane view, the branch conductive part 16B completely overlaps the common electrode 40, when at least a part of the branch conductive part 16B is removed by the laser cut or the like, there is a possibility that the branch conductive part 16B and the common electrode 40 of the drain side are conductively connected and a short-circuit failure may extend to the entire pixel electrode 20. However there is no such possibility in this exemplary embodiment.

Next, an example of the manufacturing method of the TFT array substrate 101 of this exemplary embodiment is explained.

First, a first metal film, which is to be the gate electrode 12 and the gate wire 22, is formed by the sputtering method using DC magnetron over the insulating substrate 11 formed of a transparent substrate such as a glass substrate and a quartz substrate. As the first metal film, a metal film formed of Mo, Cr, W, Al, Ta, and an alloy mainly formed of these is preferable. After that, the patterning is performed and the gate electrode 12 and the gate wire 22 are formed.

After the gate electrode 12 and the gate wire 22 are formed, the gate insulation film 13, which is the first insulation film, is formed by the plasma CVD method. As the gate insulation film 13, a silicon nitride film is common and a silicon oxide film or a silicon oxynitride may be used.

After the gate insulation film 13 is formed, the a-Si film is formed by the plasma CVD method. It is common for the a-Si film to have a laminated structure of an intrinsic semiconductor layer forming a channel and an impurity semiconductor layer including phosphorus etc. in order to ensure an ohmic contact with the source/drain electrodes 15 and 16. After that, the patterning is performed and the island-shaped a-Si semiconductor film 14 is obtained.

After the semiconductor film 14 is formed, the second metal film, which is to be the source electrode 15, the drain electrode 16, and the source wire 25, is formed by the sputtering method using DC magnetron. As the first metal film, the second metal film formed of Mo, Cr, W, Al, Ta, and an alloy mainly formed of these is preferable. After that, the patterning is performed, and the source electrode 15, the drain electrode 16, and the source wire 25 are formed.

In this process, when focusing on one pixel, a part of the drain electrode 16 or the drain electrode extended part extended from the drain electrode 16 patterns the plurality of branch conductive parts 16B that each conductively connect the drain electrode 16 and the plurality of divided pixel electrodes 20D, which are formed in a later process.

After that, as for the impurity semiconductor layer for obtaining the ohmic contact with the source/drain electrodes 15 and 16, it is common to remove a part of the impurity semiconductor layer by etching using the source/drain electrodes 15 and 16 as a mask in order to reduce the number of mask processes.

After the source/drain electrodes 15 and 16 and the source wire 25 are formed, the first transparent conductive film, which is to be the pixel electrode, is formed by the sputtering method using DC magnetron. The first transparent conductive film can be formed of ITO or IZO (Indium Zinc Oxide) or the like. After that, the patterning is performed and the pixel electrode 20 is formed. In this process, when focusing on one pixel, the pixel electrode 20 is formed with the pattern in which the pixel electrode 20 is divided into a plurality of divided pixel electrodes 20D.

In this exemplary embodiment, since a part of the corresponding divided pixel electrode 20D and the branch conductive part 16B overlap in plane view, the conductivity between corresponding divided pixel electrode 20D and the branch conductive part 16B can be favorably achieved.

After the pixel electrode 20 is formed, the passivation film 30, which is the second insulation film, is formed by the plasma CVD method. The passivation film 30 can be formed by an inorganic insulation film, such as a silicon nitride film, a silicon oxide film, a silicon oxynitride film or the like. The passivation film 30 can be also formed by coating an acrylic or imide organic insulation film. The passivation film 30 may be a laminated structure of an inorganic insulation film and an organic insulation film.

After that, contact holes are opened (not illustrated) in the passivation film 30 to obtain conductivity with the first metal film, the second metal film, and the first transparent conductive film.

After the contact holes are opened, the second transparent conductive film, which is to be the common electrode 40, is formed. The second transparent conductive film can be formed of ITO, IZO, etc. After that, the patterning is performed, and the common electrode 40 is formed. In this process, the common electrode 40 is a plate-shaped electrode with a plurality of slit-shaped openings 41 being formed.

As described above, the TFT array substrate 101 is manufactured.

When the TFT array substrate 101 is manufactured, the passivation film 30 disposed between the pixel electrode 20 and the common electrode 40 may not maintain the insulation properties due to a foreign object generated during the manufacturing process, and a pixel defect ED by a short-circuit between the pixel electrode 20 and the common electrode 40 may be generated.

As shown in FIG. 1B, when an electrical defect ED is generated in a part of the pixel by the short-circuit between the pixel electrode 20 and the common electrode 40, at least a part of the branch conductive part 16B which conductively connects the divided pixel electrode 20D including the generation region of this electrical defect ED and the drain electrode 16 is removed, and the conductive connection between the divided pixel electrode 20D including the generation region of the electrical defect ED and the drain electrode 16 is blocked.

The removal of at least a part of the branch conductive part 16B can be performed by the laser cut or the like.

In FIG. 2, the region 16A indicates a removable region by the laser cut or the like.

In FIG. 1B, a region 16C indicates an example of a removal region by the laser cut or the like.

In this exemplary embodiment, by blocking the conductive connection between the divided pixel electrode 20D including the generation region of the electrical defect ED and the drain electrode 16, the divided pixel electrode 20D including the generation region of the electrical defect ED will not operate and normal functions as an entire pixel are maintained.

According to this exemplary embodiment, a failure of the entire substrate is suppressed by one or a small number of electrical defect ED, and thereby improving the yield.

A transmissive liquid crystal display device is obtained by forming an alignment film on the top surface of the TFT array substrate 101 of this exemplary embodiment, obtaining liquid crystal cells, in which this TFT array substrate 101, a color filter (CF), and an opposing substrate including an alignment film formed thereon are adhered with a liquid crystal layer sandwiched therebetween, and attaching a polarizer, a phase difference compensation element, a back light (BL) or the like to this.

As described above, according to this exemplary embodiment, it is possible to provide a TFT array substrate 101 for the FFS mode including the configuration in which the pixel electrode 20 and the common electrode 40 are disposed opposite with the insulation film 30 interposed therebetween that can improve the quality of the product even when the electrical defect is generated in a part of the pixel, and a manufacturing method thereof.

[Second Exemplary Embodiment]

A TFT array substrate according to a second exemplary embodiment of the present invention is explained with reference to the drawings. Also for the TFT array substrate of this exemplary embodiment, the FFS mode for transmissive liquid crystal displays is explained as an example.

Figure 3:
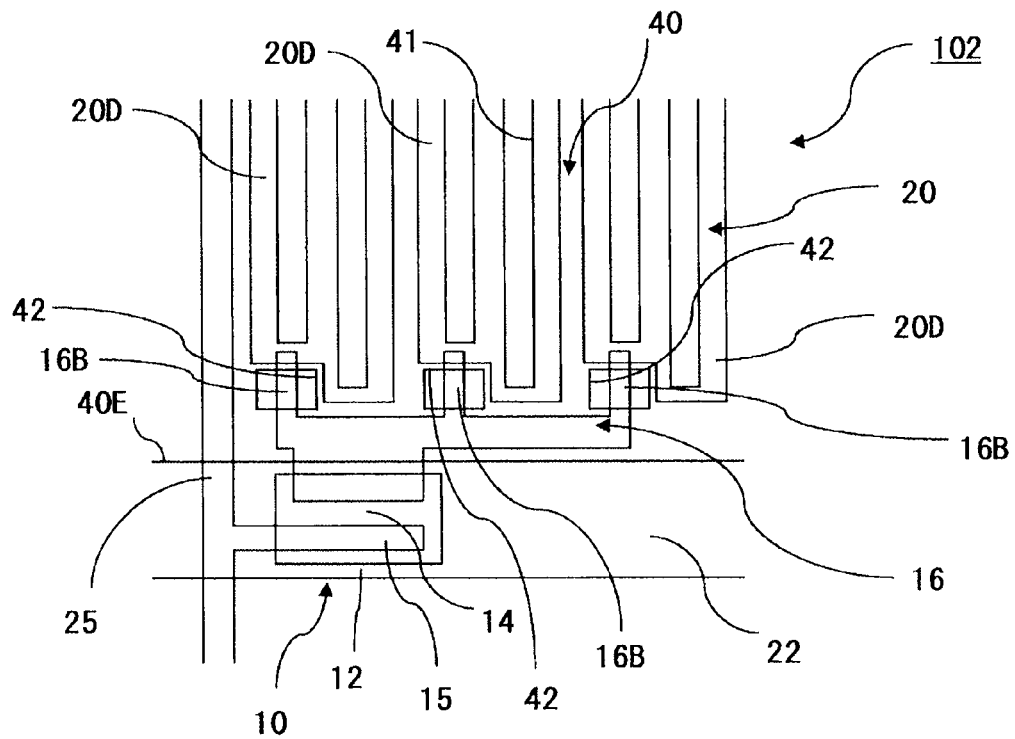
FIG. 3 is a main part plane view showing a configuration of a TFT array substrate according to a second exemplary embodiment.

FIG. 3 is a main part plane view (perspective diagram) showing a configuration of the TFT array substrate. The elements same as in the first exemplary embodiment are denoted by the same reference numerals and the explanation is omitted.

The basic configuration of the TFT array substrate 102 of this exemplary embodiment is the same as that of the exemplary embodiment, and the following points are different.

The first exemplary embodiment explained a configuration in which, in plane view, the common electrode 40 is not formed in the main part of the drain electrode 16 (the part excluding the plurality of branch conductive parts 16B) and a part of the formation region of the plurality of branch conductive parts 16B, and only the edge of the pixel electrode 20 side of the plurality of branch conductive parts 16B overlaps the common electrode 40.

In this exemplary embodiment, the formation region of the common electrode 40 is larger than the first exemplary embodiment, and in plane view, the plurality of branch conductive parts 16B are included in the formation region of the common electrode 40. Further, a large part of the main part of the drain electrode 16 (the part excluding the plurality of branch conductive parts 16B) is included in the formation region of the common electrode 40.

In this exemplary embodiment, the common electrode 40 includes an opening 42 in at least a part of the formation region of the plurality of branch conductive parts 16B. By this configuration, in plane view, the configuration is realized in which the common electrode 40 is not formed in at least a part of the formation region of the plurality of branch conductive parts 16B.

In this exemplary embodiment, it is possible to easily remove at least a part of the branch conductive part 16B by the laser cut or the like in the opened region of the opening 42 of the common electrode 40.

Also in this exemplary embodiment, when an electrical defect is generated in a part of the pixel due to the short-circuit between the pixel electrode 20 and the common electrode 40, at least a part of the branch conductive part 16B conductively connecting the divided pixel electrode 20D including the generation region of this electrical defect and the drain electrode 16 is removed. Then, the conductive connection between the divided pixel electrode 20D including the generation region of the electrical defect and the drain electrode 16 can be blocked.

If, in plane view, the branch conductive part 16B completely overlaps the common electrode 40, when at least a part of the branch conductive part 16B is removed by the laser cut or the like, there is a possibility that the branch conductive part 16B of the drain side and the common electrode 40 are conductively connected, and the short-circuit failure may expand in the entire pixel electrode 20. However in this exemplary embodiment, there is no such possibility.

This exemplary embodiment can also provide a TFT array substrate 102 for the FFS mode including a configuration in which the pixel electrode 20 and the common electrode 40 are disposed opposite with the insulation film 30 interposed therebetween that can improve the quality of the product even when the electrical defect is generated in a part of the pixel, and a manufacturing method thereof, and a liquid crystal display device using this TFT array substrate 102.

In this exemplary embodiment, it is possible to provide a liquid crystal display device which has the larger formation region of the pixel electrode 20 and higher transmittance than the first exemplary embodiment.

[Third Exemplary Embodiment]

A TFT array substrate according to a third exemplary embodiment of the present invention is explained with reference to the drawings. Also for the TFT array substrate of this exemplary embodiment, the FFS mode for the transmissive liquid crystal displays is explained as an example.

Figure 4:
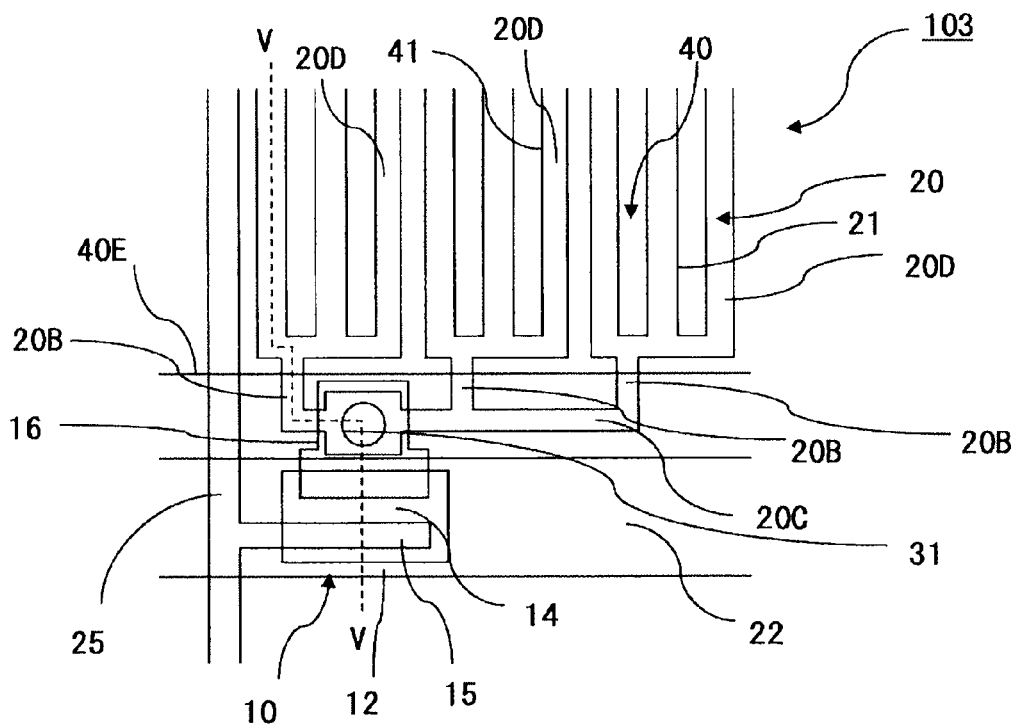
FIG. 4 is a main part plane view showing a configuration of a TFT array substrate according to a third exemplary embodiment.
Figure 5:
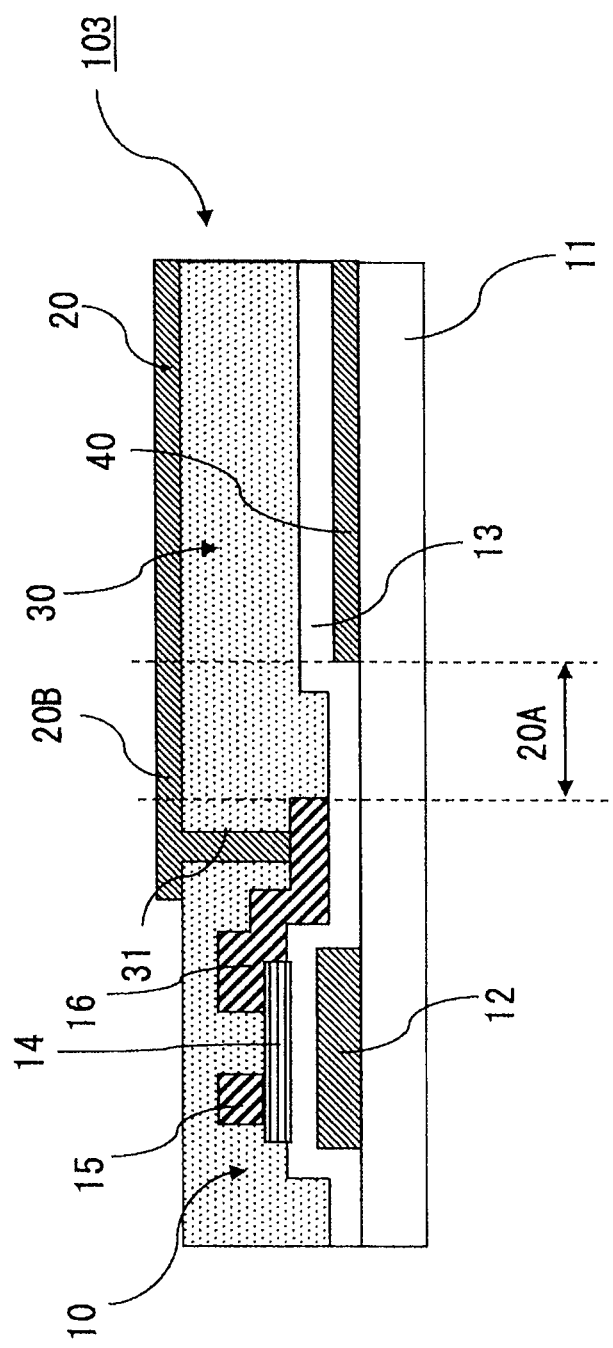
FIG. 5 is a cross-sectional view taken along line V-V of FIG. 4.

FIG. 4 is a main part plane view (perspective diagram) showing a configuration of the TFT array substrate, and FIG. 5 is a cross-sectional diagram taken along line V-V of FIG. 4. The same elements as the first exemplary embodiment are denoted by the same reference numerals, and the explanation is omitted.

The basic configuration of the TFT array substrate 103 of this exemplary embodiment is the same as that of the exemplary embodiment, and the following points are different.

The first exemplary embodiment explained the configuration in which the pixel electrode 20 is a lower electrode and the common electrode 40 is an upper electrode.

In this exemplary embodiment, the pixel electrode 20 is the upper electrode, the common electrode 40 is the lower electrode, and the drain electrode 16 and the pixel electrode 20 are conducted via a contact hole 31 that is opened in the passivation film 16.

In this exemplary embodiment, the pixel electrode 20, which is the upper electrode, is a plate-shaped electrode with a plurality of slit-shaped openings 21 being formed.

Also in this exemplary embodiment, when focusing on one pixel, the pixel electrode 20 is divided into a plurality of divided pixel electrodes 20D.

In this exemplary embodiment, when focusing on one pixel, a part of the pixel electrode 20 or a pixel electrode extended part extended from the pixel electrode 20 composes a plurality of branch conductive parts 20B that each conductively connect the drain electrode 16 and the plurality of divided pixel electrodes 20D, and a connection conductive part 20C that connects the plurality of branch conductive parts 20B and the contact hole 31.

In this exemplary embodiment, in plane view, the common electrode 40 is not formed in a part of the formation region of the connection conductive part 20C and the plurality of branch conductive parts 20B, and only edge of the plurality of branch conductive parts 20B overlaps the common electrode 40. By this configuration, in plane view, the configuration is realized in which the common electrode 40 is not formed in at least a part of the formation region of the plurality of branch conductive parts 20B.

When an electrical defect is generated in a part of the pixel by a short-circuit between the pixel electrode 20 and the common electrode 40, at least a part of the plurality of branch conductive parts 20B is removed so as to block the conductive connection between the divided pixel electrode 20 including the generation region of the electrical defect and the drain electrode 16.

In this exemplary embodiment, since the pixel electrode 20 is in the top layer and formed in the upper layer of the passivation film 30, the plurality of branch conductive parts 20B are in the top layer, and it is possible to easily remove at least a part of the branch conductive part 20B by laser cut or the like.

A region 20A in FIG. 5 indicates an example of a removable region by laser cut or the like.

Also in this exemplary embodiment, when an electrical defect is generated in a part of the pixel due to the short-circuit between the pixel electrode 20 and the common electrode 40, at least a part of the branch conductive part 20B conductively connecting the divided pixel electrode 20D including the generation region of this electrical defect and the drain electrode 16 is removed, and the conductive connection between the divided pixel electrode 20D including the generation region of the electrical defect and the drain electrode 16 can be blocked.

If, in plane view, the branch conductive part 20B completely overlaps the common electrode 40, when at least a part of the branch conductive part 20B is removed by the laser cut or the like, there is a possibility that the branch conductive part 20B of the drain side and the common electrode 40 are conductively connected, and the short-circuit failure may expand in the entire pixel electrode 20. However in this exemplary embodiment, there is no such possibility.

This exemplary embodiment can also provide a TFT array substrate 103 for the FFS mode including a configuration in which the pixel electrode 20 and the common electrode 40 are disposed opposite with the insulation film 30 interposed therebetween that can improve the quality of the product even when the electrical defect is generated in a part of the pixel, and a manufacturing method thereof, and a liquid crystal display device using this TFT array substrate 103.

[Fourth Exemplary Embodiment]

A TFT array substrate according to a fourth exemplary embodiment of the present invention is explained with reference to the drawings. Also for the TFT array substrate of this exemplary embodiment, the FFS mode for the transmissive liquid crystal displays is explained as an example.

Figure 6:
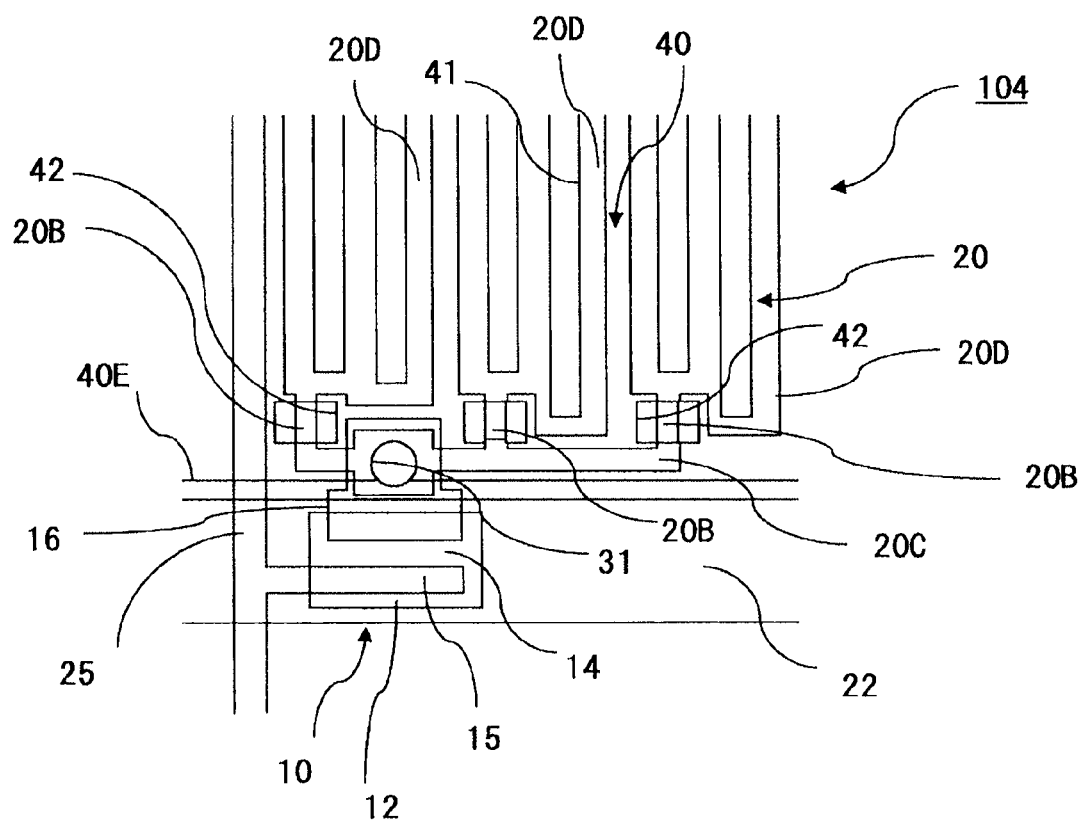
FIG. 6 is a main part plane view showing a configuration of a TFT array substrate according to a fourth exemplary embodiment.

FIG. 6 is a main part plane view (perspective diagram) showing a configuration of the TFT array substrate. The same elements as the first exemplary embodiment are denoted by the same reference numerals, and the explanation is omitted.

This exemplary embodiment incorporates the configuration of the third exemplary embodiment in the second exemplary embodiment.

Therefore, the basic configuration of a TFT array substrate 104 of this exemplary embodiment is the same as that of the second and third exemplary embodiments, and the following points are different.

Also in this exemplary embodiment, as in the third exemplary embodiment, the pixel electrode 20 is the upper electrode, the common electrode 40 is the lower electrode, and the drain electrode 16 and the pixel electrode 20 are conducted via the contact hole 31 that is opened in the passivation film 16.

Also in this exemplary embodiment, when focusing on one pixel, the pixel electrode 20 is divided into a plurality of divided pixel electrodes 20D.

In this exemplary embodiment, when focusing on one pixel, a part of the pixel electrode 20 or a pixel electrode extended part extended from the pixel electrode 20 composes a plurality of branch conductive parts 20B that each conductively connect the drain electrode 16 and the plurality of divided pixel electrodes 20D, and a connection conductive part 20C that connects the plurality of branch conductive parts 20B and the contact hole 31.

In this exemplary embodiment, as in the second exemplary embodiment, in plane view, the plurality of branch conductive parts 20B are included in the formation region of the common electrode 40, and the connection conductive part 20C is also included in the formation region of the common electrode 40.

In this exemplary embodiment, the common electrode 40 includes the opening 42 in at least the formation region of the plurality of branch conductive parts 20B. By this configuration, in plane view, the configuration is realized in which the common electrode 40 is not formed in at least a part of the formation region of the plurality of branch conductive parts 20B.

In this exemplary embodiment, as in the third exemplary embodiment, since the pixel electrode 20 is in the top layer and formed in the upper layer of the passivation film 30, the plurality of branch conductive parts 20B are in the top layer, and it is possible to easily remove at least a part of the branch conductive part 20B by laser cut or the like.

If, in plane view, the branch conductive part 20B completely overlaps the common electrode 40, when at least a part of the branch conductive part 20B is removed by the laser cut or the like, there is a possibility that the branch conductive part 20B of the drain side and the common electrode 40 are conductively connected, and the short-circuit failure may expand in the entire pixel electrode 20. However in this exemplary embodiment, there is no such possibility.

Also in this exemplary embodiment, when an electrical defect is generated in a part of the pixel due to the short-circuit between the pixel electrode 20 and the common electrode 40, at least a part of the branch conductive part 20B conductively connecting the divided pixel electrode 20D including the generation region of this electrical defect and the drain electrode 16 is removed, and the conductive connection between the divided pixel electrode 20D including the generation region of the electrical defect and the drain electrode 16 can be blocked.

This exemplary embodiment can also provide a TFT array substrate 104 for the FFS mode including a configuration in which the pixel electrode 20 and the common electrode 40 are disposed opposite with the insulation film 30 interposed therebetween that can improve the quality of the product even when the electrical defect is generated in a part of the pixel, and a manufacturing method thereof, and a liquid crystal display device using this TFT array substrate 104.

Also in this exemplary embodiment, it is possible to provide a liquid crystal display device which has the larger formation region of the pixel electrode 20 and higher transmittance than the first exemplary embodiment.

"Design Variation"

The present invention is not limited to the above exemplary embodiments, but the design can be modified in the scope without departing from the scope of the present invention.

The above exemplary embodiments explained the example of using an amorphous silicon (a-Si) film for the semiconductor film 14, however it is not limited to this but it is possible to use a microcrystalline or polycrystalline silicon film and a compound semiconductor film including oxide and/or nitride.

Although the above exemplary embodiments explained the TFT array substrate for the transmissive liquid crystal display device, it can be applied to a TFT array substrate for a reflective or transflective liquid crystal display device.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin film transistor array substrate, comprising:
   a plurality of pixels arranged in a matrix, each of the pixels including
      a gate electrode,
      a gate insulation film,
      a thin film transistor including a semiconductor film of at least one layer including a channel layer, and a source electrode and a drain electrode formed distant from each other,
      a plurality of branch conductive parts,
      a pixel electrode conductively connected to the drain electrode, and
      a common electrode that is overlapped by the pixel electrode in a plan view with an insulation film interposed therebetween, wherein
   the pixel electrode is divided into a plurality of divided pixel electrodes that are separated from each other,
   the pixel electrode is formed on a same layer as each of the plurality of branch conductive parts, the pixel electrode and the drain electrode are arranged on a same side of the insulation film, and at least a part of the pixel electrode and at least a part of each of the plurality of branch conductive parts being disposed immediately above a same film, said same film being the gate insulation film,
   each of the plurality of branch conductive parts is formed from a film alone,
   each of the plurality of branch conductive parts is connected to a corresponding different one of the plurality of divided pixel electrodes, each of the plurality of divided pixel electrodes is not directly connected to each other and is electrically connected to each other only through (i) the branch conductive part and a main portion of the drain electrode, or (ii) the branch conductive part and a connection conductive part, for each of the plurality of branch conductive parts, the edge is directly connected to the drain electrode or the connection conductive part that is electrically connected to the drain electrode, and another edge is directly connected to only one of the plurality of divided pixel electrodes, and a region not overlapped with the common electrode in the plan view is provided in at least a part of a formation region of each of the plurality of branch conductive parts.

2. The thin film transistor array substrate according to claim 1, wherein the pixel electrode or the common electrode is an upper electrode and is a plate-shaped electrode including a plurality of openings, and in plan view, the plurality of openings of the upper electrode are included in a formation region of each of the divided pixel electrode.

3. The thin film transistor array substrate according to claim 1, wherein in plane view, the plurality of branch conductive parts are included in a formation region of the common electrode, and the common electrode includes the opening in at least a part of the formation region of the plurality of branch conductive parts.

4. A liquid crystal display device comprising the thin film transistor array substrate according to claim 1.

5. A manufacturing method of a TFT array substrate according to claim 1, comprising:

when an electrical defect is generated in a part of the pixel, removing at least a part of the branch conductive part that conductively connects the divided pixel electrode including a generation region of the electrical defect and the drain electrode; and blocking the conductive connection between the divided pixel electrode including the generation region of the electrical defect and the drain electrode.

6. The thin film transistor array substrate according to claim 1, wherein:

the pixel electrode is arranged on a first plane; and the common electrode is arranged on a second plane different from the first plane.

7. The thin film transistor array substrate according to claim 1, wherein:

the common electrode is overlapped by all of each of the plurality of divided pixel electrodes in the plan view.

* * * * *